(12) United States Patent
Liu et al.

(10) Patent No.: US 10,204,779 B2
(45) Date of Patent: Feb. 12, 2019

(54) THIN FILM TRANSISTOR AND MANUFACTURING METHOD THEREOF, ARRAY SUBSTRATE AND MANUFACTURING METHOD THEREOF, DISPLAY APPARATUS

(71) Applicant: BOE TECHNOLOGY GROUP CO., LTD., Beijing (CN)

(72) Inventors: Wei Liu, Beijing (CN); Chunsheng Jiang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 184 days.

(21) Appl. No.: 14/905,982

(22) PCT Filed: Aug. 12, 2015

(86) PCT No.: PCT/CN2015/086748
§ 371 (c)(1),
(2) Date: Jan. 19, 2016

(87) PCT Pub. No.: WO2016/155189
PCT Pub. Date: Oct. 6, 2016

(65) Prior Publication Data
US 2017/0250076 A1    Aug. 31, 2017

(30) Foreign Application Priority Data
Mar. 27, 2015 (CN) .......................... 2015 1 0142322

(51) Int. Cl.
*H01L 21/20* (2006.01)
*H01L 21/02* (2006.01)
(Continued)

(52) U.S. Cl.
CPC .. *H01L 21/02614* (2013.01); *H01L 21/02565* (2013.01); *H01L 29/408* (2013.01);
(Continued)

(58) Field of Classification Search
CPC ......... H01L 21/02614; H01L 21/02565; H01L 27/1225; H01L 29/513; H01L 29/517; H01L 29/408; H01L 21/02181
See application file for complete search history.

(56) References Cited

U.S. PATENT DOCUMENTS 5,907,780 A    5/1999  Gilmer et al.
8,242,504 B2 *  8/2012  Kim ..................... H01L 29/7869
257/66

(Continued)

FOREIGN PATENT DOCUMENTS

CN    202549848 U    11/2012
CN    103730346 A    4/2014
CN    104752231 A    7/2015

OTHER PUBLICATIONS

Tsutsumi, Tadashi "Dielectric properties of Y2O3 thin films prepared by vacuum evaporation" in Japanese Journal of Applied Physics vol. 9, pp. 735-739. Published by IOP Science in 1970.*

(Continued)

*Primary Examiner* — Jesse Y Miyoshi
*Assistant Examiner* — Tuan A Hoang
(74) *Attorney, Agent, or Firm* — Nath, Goldberg & Meyer; Joshua B. Goldberg

(57) ABSTRACT

The present invention provides a thin film transistor and a manufacturing method thereof, an array substrate comprising the thin film transistor and a manufacturing method thereof, and a display apparatus comprising the array substrate. The manufacturing method of the thin film transistor comprises steps of forming a gate, a gate insulating layer, a semiconductor active layer, a source and a drain on a substrate, wherein the steps of forming the gate insulating layer and the semiconductor active layer comprise: preparing an insulating film, the insulating film comprises metal oxide insulating material; performing ion implantation on a (Continued)

predefined region of the insulating film, so that the metal oxide insulating material of partial-thickness of the insulating film in the predefined region is transformed into metal oxide semiconductor material to form the semiconductor active layer, and the rest of the insulating film forms the gate insulating layer.

12 Claims, 4 Drawing Sheets

(51) Int. Cl.
*H01L 29/49* (2006.01)
*H01L 29/40* (2006.01)
*H01L 29/66* (2006.01)
*H01L 29/786* (2006.01)
*H01L 29/45* (2006.01)
*H01L 29/51* (2006.01)
*H01L 27/12* (2006.01)

(52) U.S. Cl.
CPC .......... *H01L 29/45* (2013.01); *H01L 29/4908* (2013.01); *H01L 29/66969* (2013.01); *H01L 29/7869* (2013.01); *H01L 27/1225* (2013.01); *H01L 29/513* (2013.01); *H01L 29/517* (2013.01); *H01L 29/518* (2013.01)

(56) References Cited

U.S. PATENT DOCUMENTS

| 8,395,148 | B2 * | 3/2013 | Yamazaki | H01L 29/66742 257/43 |
|---|---|---|---|---|
| 8,541,779 | B1 * | 9/2013 | Chen | H01L 27/3246 257/40 |
| 2008/0176384 | A1 | 7/2008 | Ko | |
| 2009/0194797 | A1 | 8/2009 | Shimizu et al. | |
| 2010/0039138 | A1 * | 2/2010 | Bertin | B82Y 10/00 326/38 |
| 2013/0099232 | A1 * | 4/2013 | Cho | H01L 29/66969 257/43 |
| 2013/0285044 | A1 * | 10/2013 | Yuan | H01L 29/4908 257/43 |
| 2015/0276663 | A1 * | 10/2015 | Takechi | G01N 27/414 257/253 |

OTHER PUBLICATIONS

Minami et al. "Optical properties of aluminum doped zinc oxide thin films prepared by RF magnetron sputtering" in Japanese Journal of Applied Physics vol. 24, pp. L605-L607. Published by IOP Science in 1985.*

Lee et al. "Ultrathin hafnium oxide with low leakage and excellent reliability for alternative gate dielectric application" in International Electron Devices Meeting 1999, p. 133. Published by IEEE in 1999.*

International Search Report form 210, 220, 237 dated Nov. 10, 2015 issued in corresponding International Application No. PCT/CN2015/086748 along with an English translation of Written Opinion of International Searching Authority.

* cited by examiner

THIN FILM TRANSISTOR AND MANUFACTURING METHOD THEREOF, ARRAY SUBSTRATE AND MANUFACTURING METHOD THEREOF, DISPLAY APPARATUS

This is a National Phase Application filed under 35 U.S.C. 371 as a national stage of PCT/CN2015/086748, filed Aug. 12, 2015, an application claiming the benefit of Chinese Application No. 201510142322.4, filed Mar. 27, 2015, the content of each of which is hereby incorporated by reference in its entirety.

FIELD OF THE INVENTION

The present invention relates to the field of display technology, and particularly relates to a thin film transistor and a manufacturing method thereof, an array substrate and a manufacturing method thereof, and a display apparatus.

BACKGROUND OF THE INVENTION

Thin film transistor (TFT), as a switch control unit, is widely applied in the field of display. Taking a display panel as an example, a display region thereof comprises a plurality of pixel units arranged in an array, and each of the pixel units is provided with a TFT switch therein for controlling the pixel unit.

In traditional process procedure, the manufacturing method of a metal oxide thin film transistor mainly comprises steps of: depositing a gate metal layer above a substrate, and forming a gate by a single patterning process; depositing a gate insulating layer above the gate; depositing a metal oxide semiconductor film above the gate insulating layer, and forming a metal oxide semiconductor active layer by a single patterning process; depositing a source and drain metal layer above the metal oxide semiconductor active layer, and forming a source and a drain by a single patterning process. The manufacturing of the metal oxide thin film transistor can be finished by above steps.

On basis of this, when a TFT is manufactured by the above method, the gate insulating layer and the metal oxide semiconductor active layer are needed to be deposited respectively by independent steps, resulting in a complexity process and a high cost.

SUMMARY OF THE INVENTION

One object of embodiments of the present invention is to provide a thin film transistor and a manufacturing method thereof, an array substrate comprising the thin film transistor and a manufacturing method thereof, and a display apparatus comprising the array substrate, which can effectively simplify the manufacturing process of the thin film transistor and reduce the cost.

In order to achieve the above object, in one aspect, an embodiment of the present invention provides a manufacturing method of a thin film transistor, comprising steps of forming a gate, a gate insulating layer, a semiconductor active layer, a source and a drain on a substrate, wherein the steps of forming the gate insulating layer and the semiconductor active layer comprise: preparing an insulating film, the insulating film comprises metal oxide insulating material; performing ion implantation on a predefined region of the insulating film, so that the metal oxide insulating material of partial-thickness of the insulating film in the predefined region is transformed into metal oxide semiconductor material to form the semiconductor active layer, and the rest of the insulating film forms the gate insulating layer.

Preferably, the method further comprises: after performing ion implantation on the predefined region, performing annealing on the substrate subjected to the ion implantation.

Optionally, the metal oxide insulating material has a relative dielectric constant larger than 6.

Further preferably, the metal oxide insulating material includes hafnium oxide, the metal oxide semiconductor material includes hafnium gallium zinc oxide; or the metal oxide insulating material includes aluminum oxide, the metal oxide semiconductor material includes aluminum zinc oxide.

Further preferably, the step of forming the source and the drain comprises: forming a copper film above the semiconductor active layer, and forming the source and the drain by a single patterning process.

Based on above, preferably, the insulating film includes a silicon nitride film and a metal oxide insulating film, wherein the silicon nitride film is formed close to the gate, the metal oxide insulating film is formed far away from the gate.

In another aspect, an embodiment of the present invention provides a thin film transistor, comprising a gate, a gate insulating layer, a semiconductor active layer, a source and a drain, the semiconductor active layer is provided above the gate insulating layer and is integrated with the gate insulating layer, wherein the gate insulating layer comprises metal oxide insulating material, the semiconductor active layer comprises metal oxide semiconductor material formed by performing ion implantation on the metal oxide insulating material.

Preferably, the metal oxide insulating material has a relative dielectric constant larger than 6.

Further preferably, the metal oxide insulating material includes hafnium oxide, the metal oxide semiconductor material includes hafnium gallium zinc oxide; or the metal oxide insulating material includes aluminum oxide, the metal oxide semiconductor material includes aluminum zinc oxide.

Further, the source and the drain are provided above the semiconductor active layer, wherein the source and the drain are formed as copper electrodes.

Based on above, preferably, the gate insulating layer includes a silicon nitride film and a metal oxide insulating film, wherein the metal oxide insulating film comprising metal oxide insulating material is formed far away from the gate, the silicon nitride film comprising silicon nitride material is formed close to the gate.

In further another aspect, an embodiment of the present invention provides a manufacturing method of an array substrate, comprising the above manufacturing method of the thin film transistor.

In still another aspect, an embodiment of the present invention provides an array substrate, comprising the above thin film transistor.

In yet another aspect, an embodiment of the present invention provides a display apparatus, comprising the above array substrate.

Embodiments of the present invention provide a thin film transistor and a manufacturing method thereof, an array substrate and a manufacturing method thereof, and a display apparatus. The manufacturing method of the thin film transistor comprises steps of forming a gate, a gate insulating layer, a semiconductor active layer, a source and a drain on a substrate, wherein the steps of forming the gate insulating layer and the semiconductor active layer comprise: preparing an insulating film, the insulating film comprises metal oxide insulating material; performing ion implantation on a predefined region of the insulating film, so that the metal oxide insulating material of partial-thickness of the insulating film in the predefined region is transformed into metal oxide semiconductor material to form the semiconductor active layer, and the rest of the insulating film forms the gate insulating layer. Compared with the prior art in which the gate insulating layer and the metal oxide semiconductor active layer are formed by independent steps respectively, in the embodiments of the present invention, the gate insulating layer and the semiconductor active layer are formed simultaneously by only performing ion implantation on the predefined region of the prepared insulating film comprising metal oxide insulating material, thus the process of the embodiments of the present invention is simplified, and the cost is reduced.

BRIEF DESCRIPTION OF THE DRAWINGS

In order to clearly describe embodiments of the present invention or technical solutions of the prior art, drawings which are needed for describing the embodiments of the present invention and the prior art are briefly introduced below, obviously, these drawings only illustrate some embodiments of the present invention, other drawings may be obtained by the ordinary skills in the art in accordance with these drawings without any creative work, and in these drawings.

Figure 1A:
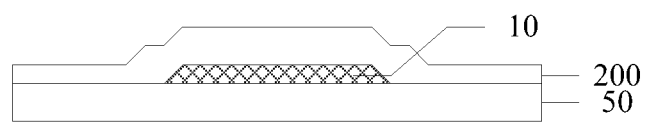
FIGS. 1A through 1C show schematic diagrams of a procedure for forming an gate insulating layer and a semiconductor active layer in accordance with an embodiment of the present invention.

REFERENCE SYMBOLS 10-gate; 20-gate insulating layer; 200-insulating film; 30-semiconductor active layer; 401-source; 402-drain; 50-substrate; R-predefined region.

DETAILED DESCRIPTION OF THE EMBODIMENTS

The technical solutions of the present invention will be described clearly and completely below in conjunction with the drawings of embodiments of the present invention, obviously, the described embodiments are only part of embodiments of the present invention but riot all of embodiments. All the other embodiments obtained by the ordinary skills in the art without any creative work falls into the scope of the present invention.

An embodiment of the present invention provides a manufacturing method of a thin film transistor, comprising steps of forming a gate 10, a gate insulating layer 20, a semiconductor active layer 30, a source 401 and a drain 402 on a substrate 50.

In the present embodiment, the step of forming the gate insulating layer 20 and the semiconductor active layer 30 specifically comprises the following sub-steps S1 and S2.

S1, as shown in FIG. 1A, preparing an insulating film 200, wherein, the insulating film 200 may comprise metal oxide insulating material.

Here, the metal oxide insulating material preferably employs the metal oxide material with a high relative dielectric constant, which can present a good insulation performance.

It should be noted that, the structure of the insulating film 200 is not limited specifically here, and it may only comprise metal oxide insulating material or may comprise other insulating materials in addition to the metal oxide insulating material. However, persons skilled in the art should understand that, when the insulating film 200 comprises metal oxide insulating material and other insulating materials, the insulating film 200 is not formed as one layer by mixing several kinds of materials, but the insulating film 200 is formed as multiple layers and each kind of insulating material constitutes one layer thereof.

For example, the insulating film 200 may be of a single-layered structure, that is, the insulating film is only formed of metal oxide insulating material; or the insulating film 200 may be of a multi-layered structure, that is, a non-metallic compound film is formed on a side close to the gate by non-metallic compound material such as silicon nitride or silicon oxide, and a metal oxide insulating film is formed on a side far away from the gate by metal oxide insulating material.

Figure 1B:
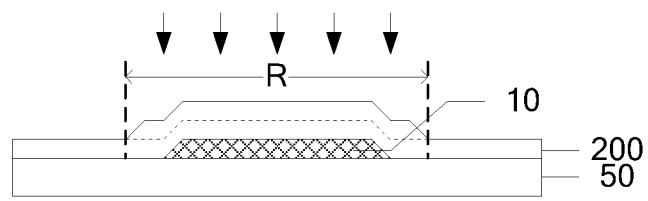
Figure 1C:
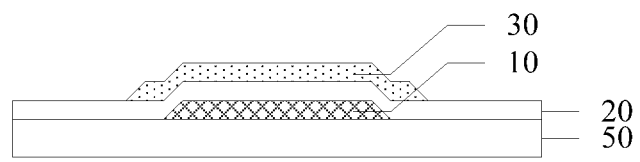

S2, as shown in FIGS. 1B and 1C, performing ion implantation on a predefined region R of the insulating film 200, so that the metal oxide insulating material of partial-thickness of the insulating film in the predefined region R is transformed into metal oxide semiconductor material to form the semiconductor active layer 30, and the rest of the insulating film forms the gate insulating layer 20.

Here, the metal oxide insulating material of partial-thickness of the insulating film in the predefined region R is transformed into metal oxide semiconductor material, that is, when the ion implantation is performed, not all metal oxide insulating material in the predefined region R is transformed into metal oxide semiconductor material, thus ensuring that there is still insulating material below the metal oxide semiconductor formed by performing ion implantation.

In the present step, the ion implantation may be performed in a low energy shallow implantation mode, wherein the energy of the ion implantation depends on the actual material and thickness of the insulating film 200, and the dose of the ion implantation depends on the doping ion concentration of the semiconductor active layer 30 to be formed.

It should be noted that, first, the predefined region is the region in the thin film transistor to form the semiconductor active layer 30 therein; secondly, the dotted line in FIG. 1B only illustrates that the part above the dotted line is the part to be performed ion implantation thereon, in practices, the dotted line is not existed, and in the present embodiment, the dotted line does not actually represents depth of the ion implantation, the depth of the ion implantation may be determined in accordance with actual situations.

Based on steps S1 and S2, the gate insulating layer 20 and the semiconductor active layer 30 may be formed simultaneously.

Compared with the prior art in which the gate insulating layer and the metal oxide semiconductor active layer are formed by independent steps respectively, in the present embodiment, the gate insulating layer 20 and the semiconductor active layer 30 are formed simultaneously by only performing ion implantation on the predefined region of the prepared insulating film 200 comprising metal oxide insulating material, thus the process of the present embodiment is simplified, and the cost is reduced.

Preferably, the method further comprises: after performing ion implantation on the predefined region R, performing annealing on the substrate subjected to the ion implantation.

In the present embodiment, specifically, the temperature of annealing may be in a range of 250° C.~350° C.

As such, a steady state of the implanted ions and the original structure may be obtained in a molten state by the annealing, thus a semiconductor with stable performance is formed, and the performance of the TFT is improved.

In the traditional manufacturing process of the thin film transistor, non-metallic compound material such as silicon nitride or silicon oxide is generally selected to form the gate insulating layer, but with development of display technology, display products with high resolution have very strict requirements on size of TFT, it is necessary to control size parameters (such as length L and width W of channel, thickness of the gate insulating layer, etc.) of TFT as small as possible in either horizontal or vertical direction. However, sharp reduction in thickness of the traditional gate insulating material may lead to leakage current of TFT devices.

On basis of this, the metal oxide insulating material in the present embodiment is the metal oxide insulating material with a relative dielectric constant K being larger than 6, that is, the relative dielectric constant of the metal oxide insulating material in the present embodiment is larger than that of the insulating material commonly used in the prior art.

There are following advantages to form the gate insulating layer by the insulating material with high value of K in the present embodiment.

In an aspect, the larger the relative dielectric constant of the material is, the better the insulating performance thereof is.

In this case, since the relative dielectric constant of the metal oxide insulating material is relatively large, the insulating performance thereof is relatively good, thus the thickness of the gate insulating layer may be set to be thinner. As such, not only the thickness of the gate insulating layer is effectively reduced, but also the problems such as short-circuit or leakage due to thinning of the gate insulating layer are avoided, ensuring that the TFT has good electrical properties.

In another aspect, the capacitance is dependent on the relative dielectric constant of the material and the distance between the upper and lower electrodes, specifically, the capacitance is proportional to the relative dielectric constant of the material and is inversely proportional to the distance between the upper and lower electrodes.

In this case, by forming the gate insulating layer having a small thickness with the insulating material having a large relative dielectric constant, not only the relative dielectric constant is increased, but also the distance between the upper and lower electrodes is reduced, thus the storage capacitance is increased effectively, and the electrical properties of the TFT substrate are improved.

Further, the metal oxide insulating material may include hafnium oxide ($HfO_2$), the metal oxide semiconductor material may correspondingly include hafnium gallium zinc oxide (HfGZO). That is, the insulating film is formed by insulating material of $HfO_2$, and the ion implantation is performed by doping gallium and zinc ions on the predefined region R of the insulating film, thus the material of $HfO_2$ of partial-thickness in the predefined region R is transformed into the material of HfGZO, the semiconductor active layer of the thin film transistor is formed.

Here, since the material of $HfO_2$ has advantages of high thermal stability, high relative dielectric constant and high density, the performance of the thin film transistor may be much improved by using the material of $HfO_2$ as the material of the insulating layer.

Alternatively, the metal oxide insulating material may include aluminum oxide ($Al_2O_3$), and the metal oxide semiconductor material may correspondingly include aluminum zinc oxide (AZO). That is, the insulating film is formed by insulating material of $Al_2O_3$, and the ion implantation is performed by doping zinc ions on the predefined region R of the insulating film, thus the material of $Al_2O_3$ of partial-thickness in the predefined region R is transformed into the material of AZO, the semiconductor active layer of the thin film transistor is formed.

In the present embodiment, the insulating film is formed of metal oxide insulating material with a high relative dielectric constant K, and the metal oxide insulating material of partial-thickness in the predefined region is transformed into metal oxide semiconductor material by performing ion implantation thereon, thus the metal oxide semiconductor active layer is formed. As such, not only the process for manufacturing the thin film transistor is simplified, but also the storage capacitance of the thin film transistor is increased, thus the obtained thin film transistor has good electrical properties.

It should be noted that, the insulating film 200 may be deposited in following two modes.

First mode, the insulating film 200 may be a film with a uniform thickness.

Specifically, the thickness of the insulating film 200 is equal to a sum of the thickness of the semiconductor active layer 30 to be formed and the thickness of the gate insulating layer 20 below the semiconductor active layer 30, in this case, after the semiconductor active layer 30 is formed, the thickness of the insulating film around the semiconductor active layer 30 is larger than that of the insulating film below the semiconductor active layer 30.

Second mode, the insulating film 200 may be a film with non-uniform thicknesses.

Specifically, the thickness of the insulating film corresponding to the predefined region R is larger, and the thickness of the insulating film around the predefined region is smaller, wherein the thickness of the insulating film corresponding to the predefined region R is equal to the sum of the thickness of the semiconductor active layer 30 to be formed and the thickness of the gate insulating layer 20 below the semiconductor active layer 30, and the thickness of the insulating film around the predefined region is equal to that of the gate insulating layer 20 below the semiconductor active layer 30. In this case, after the semiconductor active layer 30 is formed, the thickness of the insulating film around the semiconductor active layer 30 is equal to that of the insulating film below the semiconductor active layer 30.

In the present embodiment, the second mode is selected to form the insulating film 200, thus although the semiconductor active layer is to be formed by a part of the insulating film, it is not necessary to provide other regions of the insulating film with a relative large thickness. That is to say, after performing ion implantation, the gate insulating layer 20 with a suitable uniform thickness is formed and the semiconductor active layer 30 is also formed by transforming a part of the insulating film. Of course, if an insulating film with non-uniform thicknesses is to be formed, a patterning process may be performed on the insulating film to form the insulating film with a large thickness in the predefined region R and a small thickness in other regions.

Further, after the semiconductor active layer 30 is formed, the step of forming the source 401 and the drain 402 may specifically comprise: forming a copper film above the semiconductor active layer 30, and forming the source 401 and the drain 402 by a single patterning process.

As above, the source 401 and the drain 402 formed by the above step are copper electrodes with a very small resistivity, which can effectively avoid signal delay phenomenon.

Further, a passivation layer (which is not shown in the figures) may be formed above the source 401 and the drain 402.

It should be noted that, in the present embodiment, although the semiconductor active layer is formed of metal oxide insulating material, since the etching liquid for copper is of hydrogen peroxide and its impact on metal oxide semiconductor material can be ignored, it is not necessary to provide an etching stop layer in the present embodiment, thus the process for manufacturing the thin film transistor is simplified.

Based on above, since the film of silicon nitride ($SiN_x$) is relatively compact, if the gate insulating layer 20 is formed of silicon nitride ($SiN_x$), the obtained TFT may have better properties. Thus, preferably, the insulating film in the present embodiment is of a two-layered structure, that is, the insulating film includes a silicon nitride film and a metal oxide insulating film, wherein the silicon nitride film is formed close to the gate, the metal oxide insulating film is formed far away from the gate.

A specific embodiment is provided below for describing the manufacturing method and procedure of the thin film transistor in detail.

Figure 2:
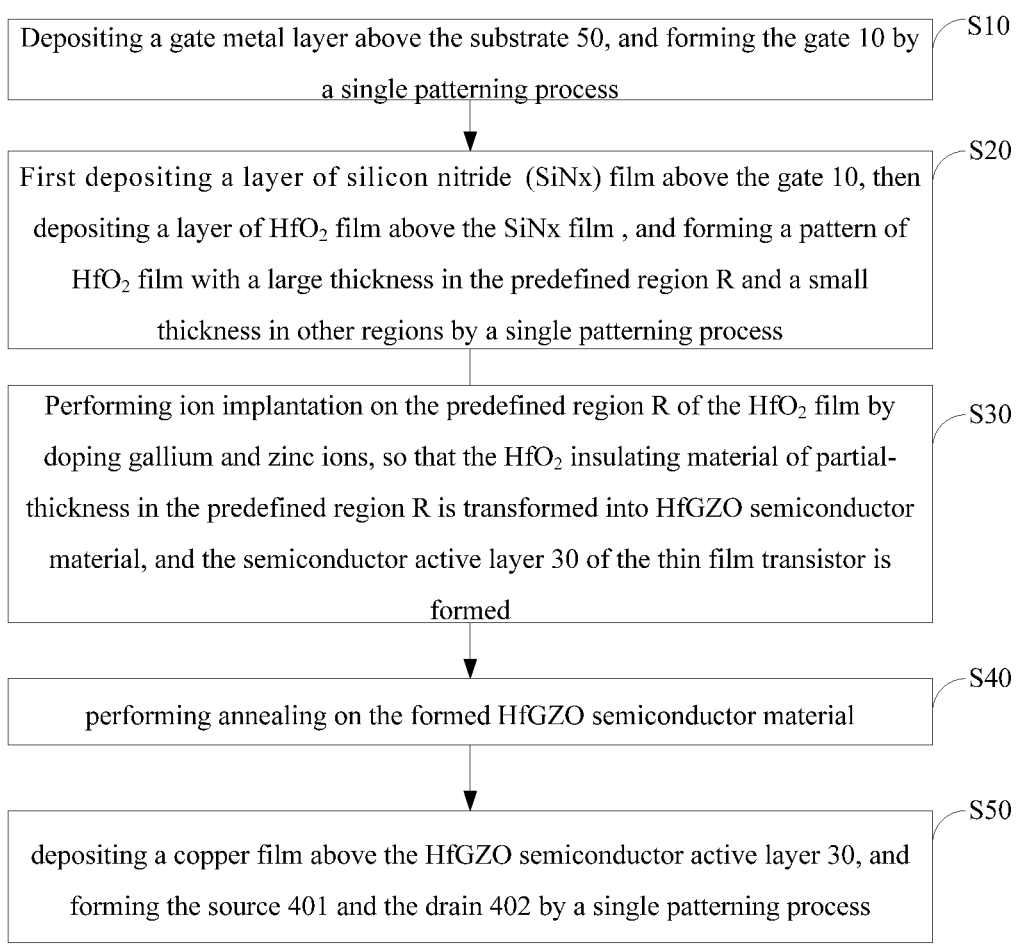
FIG. 2 shows a flowchart of a manufacturing method of a thin film transistor in accordance with an embodiment of the present invention.

As shown in FIG. 2, the manufacturing method of the thin film transistor comprises steps S10 through S50.

Figure 3A:
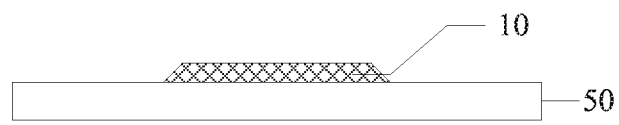
FIGS. 3A through 3D show schematic diagrams of a procedure for manufacturing a thin film transistor in accordance with an embodiment of the present disclosure.

S10: as shown in FIG. 3A, depositing a gate metal layer above the substrate 50, and forming the gate 10 by a single patterning process.

Figure 3B:
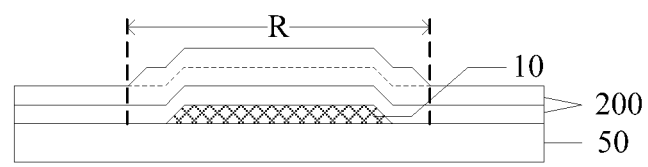

S20: as shown in FIG. 3B, first depositing a layer of $SiN_x$ film above the gate 10, then depositing a layer of $HfO_2$ film above the $SiN_x$ film, and forming a pattern of $HfO_2$ film with a large thickness in the predefined region R and a small thickness in other regions by a single patterning process.

As such, the insulating film 200 with a two-layered structure is formed by the $SiN_x$ film and the $HfO_2$ film.

Here, the dotted line in FIG. 3B only illustrates that the part above the dotted line is the part to be performed ion implantation thereon, in practices, the dotted line is not existed, and in the present embodiment, the dotted line does not actually represents depth of the ion implantation, the depth of the ion implantation may be determined in accordance with actual situations.

Figure 3C:
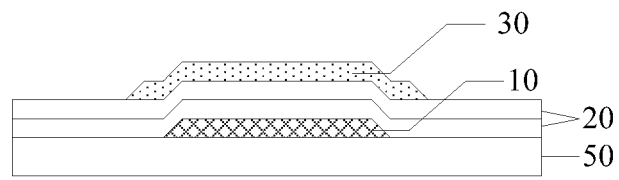

S30: as shown in FIG. 3C, the ion implantation is performed by doping gallium and zinc ions on the predefined region R of the $HfO_2$ film, so that the $HfO_2$ insulating material of partial-thickness in the predefined region R is transformed into HfGZO semiconductor material, and the semiconductor active layer 30 of the thin film transistor is formed.

In the present embodiment, the ion implantation may be performed in a low energy shallow implantation mode.

S40: performing annealing on the formed HfGZO semiconductor material.

In the present embodiment, specifically, the temperature of annealing may be in a range of 250° C.~350° C.

Figure 3D:
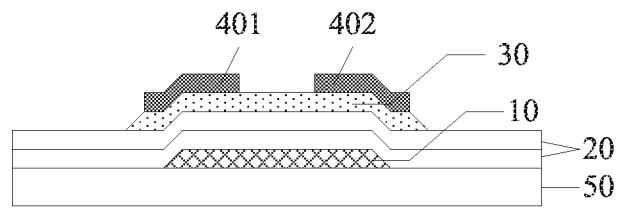
Figure 4A:
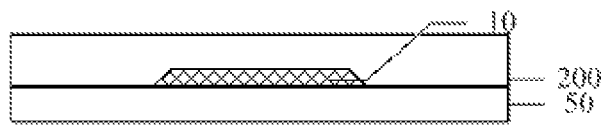
FIGS. 4A through 4C show schematic diagrams of a procedure for forming a single layer containing a gate insulating region and a semiconductor active region in accordance with an embodiment of the present disclosure.
Figure 4B:
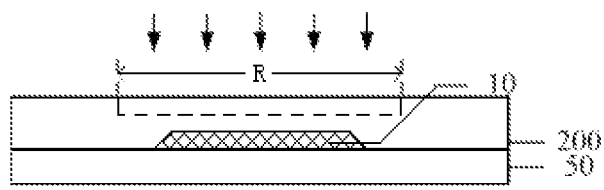
Figure 4C:
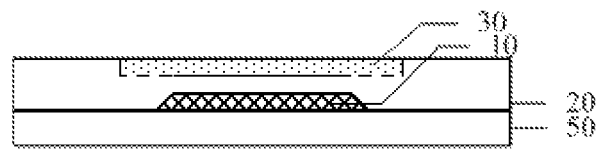

S50: as shown in FIG. 3D, depositing a copper film above the HfGZO semiconductor active layer 30, and forming a source 401 and a drain 402 by a single patterning process.

Based on the above steps S10 through S50, the metal oxide thin film transistor, the active layer of which is formed of HfGZO, is manufactured.

It should be noted that, the above $HfO_2$ film may be replaced by $Al_2O_3$ film, the gallium and zinc ions may be replaced by zinc ions. As such, the formed HfGZO semiconductor active layer may be replaced by AZO semiconductor active layer.

Of course, the above materials are only illustrative, not all materials are listed here. On a basis of this, it should be known by those skilled in the art that, all the technical solutions in which the metal oxide insulating material is transformed into the metal oxide semiconductor material by performing ion implantation fall into the protection scope of the present invention.

An embodiment of the present invention also provides a manufacturing method of an array substrate, comprising the above manufacturing method of the thin film transistor.

In the present embodiment, the array substrate may be an array substrate of a liquid crystal display apparatus or an array substrate of an organic light emitting diode display apparatus, but is not limited thereto, all components that the above thin film transistor may be applied to are within the protection scope of the present invention.

An embodiment of the present invention also provides a thin film transistor, as shown in FIG. 3D, comprising a gate 10, a gate insulating layer 20, a semiconductor active layer 30, a source 401 and a drain 402, wherein the semiconductor active layer 30 is provided above the gate insulating layer 20 and is integrated with the gate insulating layer 20.

The gate insulating layer 20 comprises metal oxide insulating material, the semiconductor active layer 30 comprises metal oxide semiconductor material formed by performing ion implantation on the metal oxide insulating material.

Here, the description that the semiconductor active layer 30 is integrated with the gate insulating layer 20 refers to that, both the semiconductor active layer 30 and the gate insulating layer 20 are formed by the previous formed insulating film.

In the present embodiment, the gate insulating layer 20 is preferably formed of metal oxide insulating material with a high relative dielectric constant K, wherein the relative dielectric constant of the meatal oxide insulating material is preferably larger than 6.

Since the metal oxide insulating material with a high relative dielectric constant K has a good insulating performance, the gate insulating layer 20 may be provided to be thinner without producing problems such as short-circuit or leakage. Moreover, with reduction of the thickness of the gate insulating layer 20, the distance between the upper and lower electrodes is correspondingly reduced. In addition, compared to the prior art in which the gate insulating layer is formed of silicon nitride or silicon oxide material, for gate insulating layers of the same thickness, using the metal oxide insulation material with a high relative dielectric constant K can increase the storage capacitance more effectively than using silicon nitride or silicon oxide, thus the electrical properties of the TFT substrate is enhanced. On the other hand, compared to silicon nitride or silicon oxide material, the metal oxide insulating material with a relative dielectric constant being larger than 6 has better insulating performance, thus if the gate insulating layer is formed of the metal oxide insulating material with a relative dielectric constant being larger than 6, even the thickness of the gate insulating layer is not thinned, the same electrical properties as those in the case of forming a very thin gate insulating layer with silicon nitride or silicon oxide can still be achieved.

Preferably, the metal oxide insulating material may include $HfO_2$, the metal oxide semiconductor material may correspondingly include HfGZO; or, the metal oxide insulating material may include $Al_2O_3$, the metal oxide semiconductor material may correspondingly include AZO.

Here, both $HfO_2$ and $Al_2O_3$ are metal oxide materials with a high relative dielectric constant, and each of them is transformed into the corresponding metal oxide semiconductor material by performing ion implantation thereon to be used as the semiconductor active layer in the thin film transistor.

Further preferably, the source 401 and the drain 402 are provided above the semiconductor active layer 30, wherein the source 401 and the drain 402 may be copper electrodes.

Here, since the copper electrodes have a low resistivity, signal delay phenomenon is effectively reduced by using the copper electrodes as the source and the drain.

Further, a passivation layer may be provided above the source 401 and the drain 402.

In the present embodiment, although the metal oxide semiconductor active layer is employed, since the etching liquid for copper is of hydrogen peroxide and its impact on metal oxide semiconductor material can be ignored, it is not necessary to provide an etching stop layer in the present embodiment, thus the process for manufacturing the thin film transistor is simplified.

Based on above, preferably, the gate insulating layer 20 at least includes a two-layer structure, that is, the gate insulating layer may include a silicon nitride insulating layer and a metal oxide insulating layer, wherein the silicon nitride insulating layer formed of silicon nitride material is provided close to the gate 10, the metal oxide insulating layer formed of metal oxide insulating material is provided far away from the gate 10.

As an example, the gate insulating layer 20 may be provided in a two-layered structure, and a silicon nitride insulating layer is first provided above the gate 10, then an $HfO_2$ metal oxide insulating layer is provided above the silicon nitride insulating layer. In this case, since the structure of silicon nitride material is relatively compact, using the silicon nitride material to form the insulating layer may effectively improve the performance of the thin film transistor.

An embodiment of the present invention also provides an array substrate comprising the above thin film transistor and a display apparatus comprising the array substrate.

The array substrate may be an array substrate of a liquid crystal display apparatus or an array substrate of an organic light emitting diode display apparatus, and is not limited thereto, all components that the above thin film transistor may be applied to are within the protection scope of the present invention. In addition, the display apparatus may be any product or component with a display function, such as liquid crystal display panel, electronic paper, OLED display panel, telephone, tablet computer, television, display, notebook computer, digital photo frame, navigator, and so on.

The above implementations are merely specific implementations of the present invention, rather than limiting the present invention. Various variations and improvements obtained by those of ordinary skill in the art without departing from the spirit and essence of the present invention are regarded within the protection scope of the present invention.

The invention claimed is:

1. A manufacturing method of a thin film transistor, comprising steps of forming a gate, a gate insulating layer, a semiconductor active layer, a source and a drain on a substrate, wherein the steps of forming the gate insulating layer and the semiconductor active layer comprise:
   preparing an insulating film, the insulating film comprises metal oxide insulating material;
   performing ion implantation on a predefined region of the insulating film, so that the metal oxide insulating material of partial-thickness of the insulating film in the predefined region is transformed into metal oxide semiconductor material to form the semiconductor active layer, and the rest of the insulating film forms the gate insulating layer.

2. The method of claim 1, further comprises:
   after performing ion implantation on the predefined region, performing annealing on the substrate subjected to the ion implantation.

3. The method of claim 1, wherein the metal oxide insulating material has a relative dielectric constant larger than 6.

4. The method of claim 3, wherein the metal oxide insulating material includes hafnium oxide, the metal oxide semiconductor material includes hafnium gallium zinc oxide.

5. The method of claim 3, wherein the metal oxide insulating material includes aluminum oxide, the metal oxide semiconductor material includes aluminum zinc oxide.

6. The method of claim 1, wherein the step of forming the source and the drain comprises:
   forming a copper film above the semiconductor active layer, and forming the source and the drain by a single patterning process.

7. The method of claim 1, wherein,
   the insulating film includes a silicon nitride film and a metal oxide insulating film, wherein the silicon nitride film is formed close to the gate, the metal oxide insulating film is formed far away from the gate.

8. The method of claim 2, wherein,
   the insulating film includes a silicon nitride film and a metal oxide insulating film, wherein the silicon nitride film is formed close to the gate, the metal oxide insulating film is formed far away from the gate.

9. The method of claim 3, wherein,
   the insulating film includes a silicon nitride film and a metal oxide insulating film, wherein the silicon nitride film is formed close to the gate, the metal oxide insulating film is formed far away from the gate.

10. A manufacturing method of an array substrate, comprising the manufacturing method of the thin film transistor of claim 1.

11. The method of claim 4, wherein,
    the insulating film includes a silicon nitride film and a metal oxide insulating film, wherein the silicon nitride film is formed close to the gate, the metal oxide insulating film is formed far away from the gate.

12. The method of claim 5, wherein,
    the insulating film includes a silicon nitride film and a metal oxide insulating film, wherein the silicon nitride film is formed close to the gate, the metal oxide insulating film is formed far away from the gate.

* * * * *